METHOD OF COATING PN JUNCTION OF SEMICONDUCTOR DEVICE WITH MIXTURE OF $SiO_2$ AND $TiO_2$

Original Filed Nov. 13, 1968

3,698,945
Patented Oct. 17, 1972

3,698,945

METHOD OF COATING PN JUNCTION OF SEMICONDUCTOR DEVICE WITH MIXTURE OF $SiO_2$ AND $TiO_2$

Masami Yokozawa and Hitoo Iwasa, Osaka, Japan, assignors to Matsushita Electronics Corporation, Osaka, Japan Original application Nov. 13, 1968, Ser. No. 775,355, now Patent No. 3,629,666. Divided and this application July 2, 1970, Ser. No. 60,966
Claims priority, application Japan, Nov. 22, 1967, 42/75,585
Int. Cl. B44d *1/02*
U.S. Cl. 117—201 4 Claims

ABSTRACT OF THE DISCLOSURE

A semiconductor device with at least one PN junction and a method of manufacturing the same wherein a passivating film or a surface film for insulation is made of a chemical mixture of oxides composed of $SiO_2$–$TiO_2$ so that the breakdown voltage and electrical stability of said PN junction can be increased. This effect is based on the suppression of movement of alkali ions in said film with the mixture of oxides. The film with the mixture of oxides composed of $SiO_2$–$TiO_2$ is obtained with a method where vapors of organo-oxy-silicon compound and organo-oxy-titanium compound are led onto a substrate, which is heated and sustained at a predetermined temperature, and pyrolized on a surface of the substrate to make the film.

CROSS-REFERENCES TO RELATED APPLICATIONS

This is a division of application Ser. No. 775,355, filed Nov. 13, 1968, now Pat. No. 3,629,666.

BACKGROUND OF THE INVENTION

The present invention relates to a semiconductor device in which a passivating film is formed on the surface of one or more PN junctions included in said semiconductor device such as a diode or a transistor.

A silicon dioxide film ($SiO_2$) has been used widely as a passivating film for semiconductor devices having PN junctions. It is also known that if there are alkali ions, for example sodium ions, in the $SiO_2$ film, they have a bad influence upon the breakdown characteristics and secular variation characteristics and it is a fact that many methods to obtain a stable $SiO_2$ passivating film with less alkali ions are adopted especially in the manufacturing process. The object of the present invention is to improve characteristics of a semiconductor device with an $SiO_2$ film and the invention is characterized by using a homogeneous film with a mixture of oxides composed of $SiO_2$ and titanium dioxide ($TiO_2$) as a surface passivating film in a semiconductor device.

DESCRIPTION OF THE PREFERRED EMBODIMENTS

Figure 1:
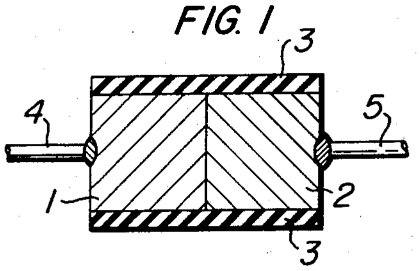
FIG. 1 is a schematic cross-sectional view of a semiconductor device according to the present invention.

FIG. 1 is a schematic cross-sectional view of a diode as an example of a semiconductor device according to the present invention and showing the situation where said film with the mixture of oxides 3 is laid on the surface of the semiconductor device with a PN junction formed of P type semiconductor 1 and N type semiconductor 2. And reference numerals 4 and 5 designate electrodes.

Figure 2:
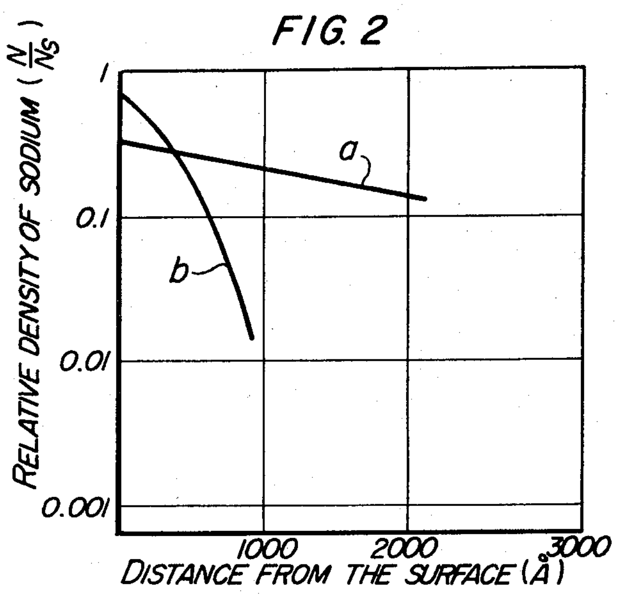
FIG. 2 and FIG. 3 are views showing characteristics of a passivating film according to the present invention.

In said film with the mixture of oxides, even if there are an appreciable number of alkali ions, such as sodium ions, which move easily, they are electrically trapped by oxide $TiO_2$. Consequently, the film becomes stable and moreover its electric strength becomes high to improve the breakdown characteristics of the device. This can also be proved with FIG. 2. FIG. 2 shows the relative density of sodium in the film (N) with respect to that in the surface ($N_S$), as a function of the distance from the surface, and also shows movement of sodium ions in a film in accordance with the prior art and in the film with the mixture of oxides according to the present invention. These characteristics are given by observing the distribution of the sodium ions prevented from the surface of the films by heat treatment during 24 hours at 600° C. after the sodium is laid on the surface. In the drawing, *a* and *b* correspond to the case of the $SiO_2$ film and the case of the film with the mixture of oxides, $SiO_2$ and $TiO_2$ in which $TiO_2$ is mixed by 20%. It is obvious from the drawing that the sodium ions are hard to move in the film composed of the mixture of oxides, $SiO_2$ and $TiO_2$.

The film with the mixture of oxides according to the present invention can be formed with the following method. Organo-oxy-silicon compound, for example tetra-ethoxy-silane ($SiO[OC_2H_5]_4$, and organo-oxy-titanium compound, for example, tetra-iso-propyl-titanate ($Ti[OC_3H_7]_4$), are heated and evaporated respectively at a predetermined temperature and mixed, or a little amount of oxygen is added to the mixture, then the mixture is led into a reactant tube with inert gas such as nitrogen or argon and pyrolized on the surface of the semiconductor device which is heated and sustained at 250°–500° C. to make the uniform amorphous film with the mixture of oxides, $SiO_2$ and $TiO_2$, on the surface of the semiconductor device. The addition of oxygen promotes the reaction of pyrolysis, especially.

Figure 3:
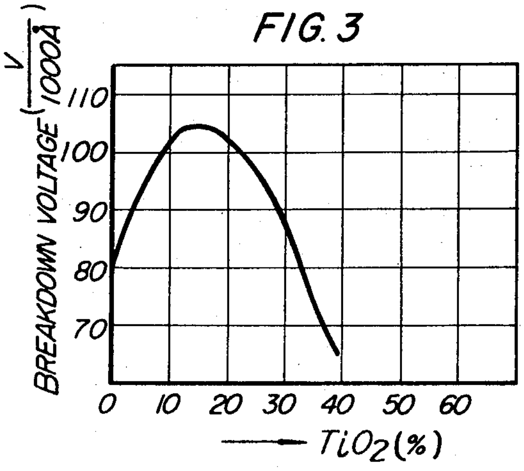

FIG. 3 shows a relation between the volume ratio of $TiO_2$ mixed into $SiO_2$ and the electric strength of the film. Referring to FIG. 3, it is obvious that the mixture of $TiO_2$ into $SiO_2$ by within about 5–30% is remarkably effective.

And the same result may be obtained with so-called multiple layers, which consist of, for example, a first layer of $SiO_2$ disposed on a semiconductor element, a second layer of a mixture of $SiO_2$ and $TiO_2$ formed on the first layer and a third layer of $TiO_2$ formed on the second layer, as a passivating film. The second layer of the mixture may be dispensed with if so desired so that the third layer may be on the first layer.

As described above, a semiconductor device having the film with the mixture of oxides composed of $SiO_2$ and $TiO_2$ according to the present invention as a passivating film improves its passivation effect of $SiO_2$ for PN junctions and has good breakdown and secular variation characteristics.

What is claimed is:

1. A method of manufacturing semiconductor devices having a film composed of silicon dioxide and titanium dioxide for isolation on a surface of a semiconductor including at least one PN junction, characterized in that said film for isolation is formed in a manner that a mixture of vapors of organo-oxy-silicon compound and organo-oxy-titanium compound is led onto a semiconductor substrate, which is heated and sustained at a temperature between 250°–500° C., along with a little amount of oxygen and an inert gas as a carrier gas and pyrolized.

2. A method according to claim 1, wherein said film composed of silicon dioxide and titanium dioxide contains titanium dioxide 5–30% by volume.

3. A method of manufacturing semiconductor devices having a film composed of silicon dioxide and titanium dioxide for isolation on a surface of a semiconductor including at least one PN junction, comprising the steps of:

(a) maintaining said surface of said semiconductor at a temperautre of between 250°–500° C.;

(b) mixing vapors of organo-oxy-silicon compound and organo-oxy-titanium compound in an atmosphere of oxygen and inert gas and;

(c) pyrolizing the combination of step (b) on said surface of said semiconductor at said temperature of between 250°–500° C.

4. The method according to claim 3, wherein said film contains titanium dioxide in an amount of between 5–30% by volume.

References Cited

UNITED STATES PATENTS

| | | | |
|---|---|---|---|
| 3,614,548 | 10/1971 | Takatsuki | 317—234 AG |
| 3,396,052 | 8/1968 | Rand | 317—235 AQ |
| 2,916,681 | 12/1959 | Brady et al. | 117—106 D |
| 3,304,200 | 2/1967 | Statham | 317—235 AQ |
| 3,511,703 | 5/1970 | Peterson | 317—235 AQ |
| 3,441,812 | 4/1969 | Bucs et al. | 317—235 AQ |

ALFRED L. LEAVITT, Primary Examiner

C. K. WEIFFENBACH, Assistant Examiner

U.S. Cl. X.R.

117—106 R